(12) United States Patent
Kawaguchi et al.

(10) Patent No.: US 9,502,738 B2
(45) Date of Patent: Nov. 22, 2016

(54) POWER STORAGE DEVICE

(71) Applicants: Daisuke Kawaguchi, Kanagawa (JP); Akira Iida, Tokyo (JP); Toru Suzuki, Kanagawa (JP)

(72) Inventors: Daisuke Kawaguchi, Kanagawa (JP); Akira Iida, Tokyo (JP); Toru Suzuki, Kanagawa (JP)

(73) Assignees: NEC Corporation, Tokyo (JP); NEC Engineering, Ltd., Kanagawa (JP); (Continued)

( * ) Notice: Subject to any disclaimer, the term of this patent is extended or adjusted under 35 U.S.C. 154(b) by 261 days.

(21) Appl. No.: 14/384,888

(22) PCT Filed: Mar. 15, 2013

(86) PCT No.: PCT/JP2013/057444
§ 371 (c)(1),
(2) Date: Sep. 12, 2014

(87) PCT Pub. No.: WO2013/137448
PCT Pub. Date: Sep. 19, 2013

(65) Prior Publication Data
US 2015/0030889 A1     Jan. 29, 2015

(30) Foreign Application Priority Data
Mar. 16, 2012   (JP) ................. 2012-060725

(51) Int. Cl.
*H01M 10/42* (2006.01)
*H01M 2/02* (2006.01)
(Continued)

(52) U.S. Cl.
CPC ....... *H01M 10/4257* (2013.01); *H01M 2/0245* (2013.01); *H01M 2/1016* (2013.01);
(Continued)

(58) Field of Classification Search
CPC .................. H01M 10/425; H01M 2010/4271; H01M 2010/4278; H01M 2/0245;
(Continued)

(56) References Cited

U.S. PATENT DOCUMENTS 5,149,604 A * 9/1992 Nakanishi ........... H01M 2/1044
429/97
5,608,612 A * 3/1997 Hokao .................. G06F 1/1626
361/616
(Continued)

FOREIGN PATENT DOCUMENTS

JP    59-129166 U    8/1984
JP    04-059064 U    5/1992
(Continued)

OTHER PUBLICATIONS

International Search Report corresponding to PCT/JP2013/057444, dated May 7, 2013 (5 pages).

*Primary Examiner* — Ula C Ruddock
*Assistant Examiner* — Amanda Barrow
(74) *Attorney, Agent, or Firm* — Wilmer Cutler Pickering Hale and Dorr LLP

(57) ABSTRACT

A power storage device includes a battery containing body, an electronic device unit, and a chassis for housing them, wherein at a side surface portion of the chassis, an opening for inserting and removing the battery containing body and the electronic device unit is provided; an openable and closable pivoting member is provided inside the opening, the pivoting member, when closed, preventing removal of the battery containing body, and when opened, preventing insertion of the electronic device unit as removed; and the electronic device unit is housed and disposed adjacent to the battery containing body, and includes an opening prevention guide capable of engaging with the pivoting member and (Continued)

thereby preventing the pivoting member from being opened when the electronic device unit is housed.

16 Claims, 10 Drawing Sheets

(73) Assignees: NEC Energy Devices, Ltd., Kanagawa (JP)

(51) Int. Cl.
*H01M 10/0525* (2010.01)
*H01M 2/10* (2006.01)
*H02B 1/36* (2006.01)
*H02B 1/38* (2006.01)
*H05K 5/02* (2006.01)

(52) U.S. Cl.
CPC ......... *H01M 2/1044* (2013.01); *H01M 2/1066* (2013.01); *H01M 2/1077* (2013.01); *H01M 10/425* (2013.01); *H02B 1/36* (2013.01); *H02B 1/38* (2013.01); *H05K 5/0208* (2013.01); *H05K 5/0217* (2013.01); *H01M 10/0525* (2013.01); *H01M 2010/4271* (2013.01); *H01M 2010/4278* (2013.01); *H01M 2220/10* (2013.01)

(58) Field of Classification Search
CPC ................. H01M 2/10; H01M 2/1016; H01M 2/1044; H01M 2/1055; H01M 2/1066; H01M 2/1077; H04B 2001/084; H04B 1/08; H04B 1/086; H04B 1/088; H02B 1/36; H02B 1/38; H05K 5/02; H05K 5/0208; H05K 5/0217; H05K 5/0221
See application file for complete search history.

(56) References Cited

U.S. PATENT DOCUMENTS

| 2006/0056142 | A1 | 3/2006 | Takahashi et al. |
| 2007/0108877 | A1* | 5/2007 | Bergmann ............ E05B 65/02 312/219 |
| 2009/0256525 | A1* | 10/2009 | Kitanaka ............... B60L 3/0046 320/134 |
| 2012/0265004 | A1* | 10/2012 | Kaushansky ....... A61M 1/1072 600/18 |

FOREIGN PATENT DOCUMENTS

| JP | 09-322313 A | 12/1997 |
| JP | 11-115504 A | 4/1999 |
| JP | 3079998 U | 6/2001 |
| JP | 2001-325941 A | 11/2001 |
| JP | 2006-079751 A | 3/2006 |
| JP | 2010-140728 A | 6/2010 |
| JP | 2010-182541 A | 8/2010 |
| JP | 2012-009309 A | 1/2012 |
| JP | 2012-009310 A | 1/2012 |
| JP | 2012-009311 A | 1/2012 |

\* cited by examiner

POWER STORAGE DEVICE

CROSS-REFERENCE TO RELATED APPLICATIONS

This application is a national stage application of International Application No. PCT/JP2013/057444 entitled "Power Storage Device," filed on Mar. 15, 2013, which claims the benefit of the priority of Japanese Patent Application No. 2012-060725, filed on Mar. 16, 2012, the disclosures of each of which are hereby incorporated by reference in their entirety.

TECHNICAL FIELD

The present invention relates to a power storage device.

BACKGROUND ART

Power storage devices each include a plurality of secondary batteries, and can discharge power stored in the secondary batteries as necessary. For example, the power storage devices can discharge, in the daytime, power stored late at night when the electricity rate is low, and discharge, at night, power stored in the daytime by photovoltaic power generation. Also, in case of a blackout, the power storage devices can discharge power stored in the power storage devices up to that time.

Such power storage devices have often been installed in, e.g., industrial or business establishments, but, in recent years, they are beginning to be installed more in general residential houses as well.

Currently, secondary batteries used for power storage devices are generally film-package batteries. A film package battery contains battery elements formed by alternately stacking positive plates and negative plates via separators, and the battery elements and an electrolyte solution are encapsulated in a container formed of a packaging film such as a laminate film.

Patent Literature 1 describes a power storage device in which a lithium ion battery with a plurality of cells integrally packed therein is arranged in a cuboidal casing with its periphery surrounded by metal plates. The inside of the casing is separated by a wall into right and left spaces, and in one of the spaces, the lithium ion battery and a charging unit therefor are disposed. In the other space, a controller that converts power from the battery to alternate-current power and supplies the alternate-current power is disposed, and a heat dissipation space exists between the controller and the wall.

Patent Literature 2 describes a power storage system including a battery module including a plurality of battery cells and a housing case that houses the battery module, in which charge accumulated in the battery module is converted into alternate-current power and supplied to a load. The housing case has a cuboidal shape with a surface having a largest area as a front portion, and in the housing case, a plurality of the cuboidal battery modules are housed. These battery modules are arranged in such a manner that the front portion of the housing case and a surface of each battery module that has a largest area face each other, and can be inserted/removed to/from the housing case through a side portion of the housing case. Furthermore, inside the housing case, a controller that controls conversion to alternate-current power or charging/discharging of the battery modules is disposed.

CITATION LIST

Patent Literature

Patent Literature 1: JP2010-182541A
Patent Literature 2: JP2012-9309A

SUMMARY OF INVENTION

Technical Problem

In the power storage device described in Patent Literature 1, a battery with a plurality of cells integrally packed therein is housed in a casing. Thus, at the time of work for installation, or maintenance and inspection of the battery, transfer of the entire integrated battery into and from the casing is necessary. As described in Patent Literature 1, the battery has large weight, and the work for transferring such battery in and out requires a lot of labor. Also, since the battery is an integrated one, even if a battery failure is identified, it is impossible to individually determine whether the respective cells have a failure in the battery as housed in the power storage device or transfer only a cell having a failure to and from the power storage device for repair or replacement.

In the power storage system described in Patent Literature 2, a plurality of battery modules with a plurality of cell housed therein are housed in a housing case. Such power storage device enables achievement of a compact size and easy maintenance. However, at the time of work for installation, maintenance and inspection of the power storage system, it is necessary to transfer each battery module from and to the housing case.

A power storage system generally includes electronic devices such as a battery management unit (BMU) and an AC/DC conversion unit (PCS unit) other than the battery modules, and these units are also transferred to and from the housing case at the time of work for installation or maintenance and inspection of the power storage system. In such cases, in particular, if the BMU and the battery modules are loaded/unloaded in the wrong order, power from the battery modules leaks (counterflows) to the other devices such as the PCS unit, which may cause a failure.

An object of the present invention is to provide a power storage device and a power storage system that can solve any one of the above problems.

Solution to Problem

An aspect of the present invention provides a power storage device including a battery containing body, an electronic device unit, and a chassis for housing the battery containing body and the electronic device unit, wherein at a side surface portion of the chassis, an opening for inserting and removing the battery containing body and the electronic device unit via the side surface portion is provided; an openable and closable pivoting member is provided inside the opening, the pivoting member, when closed, preventing removal of the battery containing body, and when opened, preventing insertion of the electronic device unit as removed; and the electronic device unit is housed and disposed adjacent to the battery containing body, and includes an opening prevention guide capable of engaging with the pivoting member and thereby preventing the pivoting member from being opened when the electronic device unit is housed.

Another aspect of the present invention provides a power storage system including the above power storage device, and a control system unit for controlling the power storage device.

Advantageous Effects of Invention

An exemplary embodiment of the present invention can solve at least one of the above problems.

DESCRIPTION OF EMBODIMENT

Figure 1A:
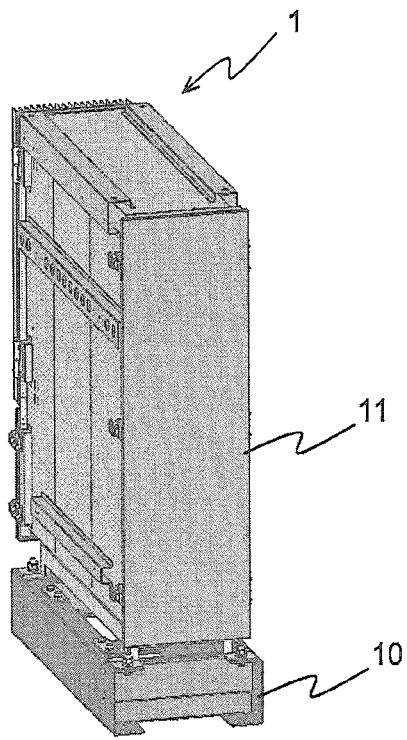
FIG. 1A is a front-side perspective view illustrating an outer appearance of a chassis of a power storage device according to an exemplary embodiment of the present invention.

A power storage device and a power storage system according to an exemplary embodiment of the present invention will be described below with reference to the drawings.

According to an exemplary embodiment of the present invention, a power storage device including a plurality of battery containing bodies (for example, battery modules or battery packs), a power conditioner (hereinafter referred to as "PCS unit"), a battery management unit (hereinafter referred to as "BMU") and a chassis that houses these can be provided, and a power storage system including the power storage device, and a control system unit (for example, a system controller) for controlling the power storage device can be also provided. The power storage device and the power storage system can be connected, for example, between a commercial power supply provided in a general household and a load such as a home appliance for use as a backup power supply or supplementary power for the case of, e.g., a blackout, and furthermore, for use for supply of extra power to the commercial power source. In households provided with a household dispersed power source such as a solar cell system or a micro wind power generator, the household dispersed power source can be connected to the power storage system.

The BMU is provided between the respective battery containing bodies, and the PCS unit and the control system unit, and collects information on the states of the respective battery containing bodies and determines the states of the respective battery containing bodies based on the collected information. Also, the BMU outputs information indicating the states of the respective battery containing bodies to the PCS unit and the control system unit based on the results of the determination.

The PCS unit converts alternate current supplied from an external power supply (e.g., a commercial power supply) to direct current and outputs the direct current to the respective battery containing bodies, and also converts direct current supplied from the respective battery containing bodies to alternate current and outputs the alternate current to the outside (a load).

The control system unit mainly includes an arithmetic processor, a memory and a program stored in the memory, and comprehensively controls the power storage device. The control system unit, for example, manages and controls information transmission between the BMU and the PCS unit, manages and controls the amounts of charge and discharge of the battery containing bodies, or switches between operation modes (a charge mode and a discharge mode) of the power storage device according to the program. The control system unit can be arranged outside of chassis 1, separately from the power storage device, using a control device such as a personal computer. Also, the control system unit may be provided in the power storage device.

The BMU is electrically connected to the battery containing bodies and the PCS unit (direct-current connection), and the PCS unit is electrically connected to the external power supply or the load (alternate-current connection). The control system unit is connected in such a manner that the control system unit can communicate with the BMU and the PCS unit.

Figure 1B:
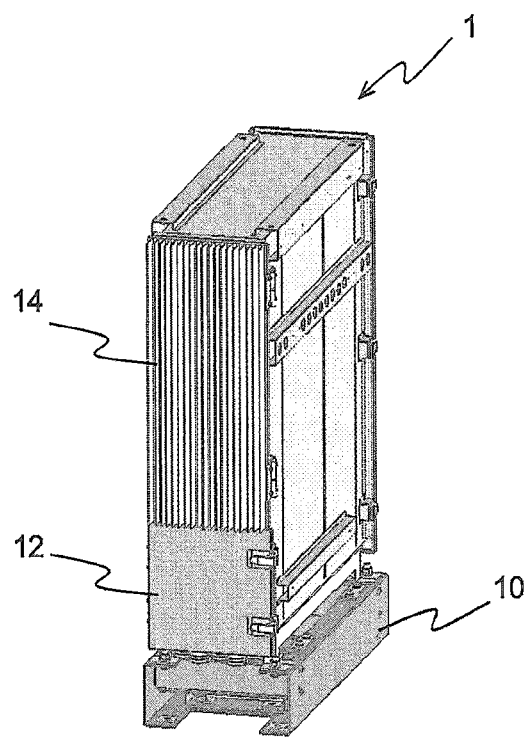
FIG. 1B is a rear-side perspective view illustrating an outer appearance of a chassis of a power storage device according to an exemplary embodiment of the present invention.
Figure 2A:
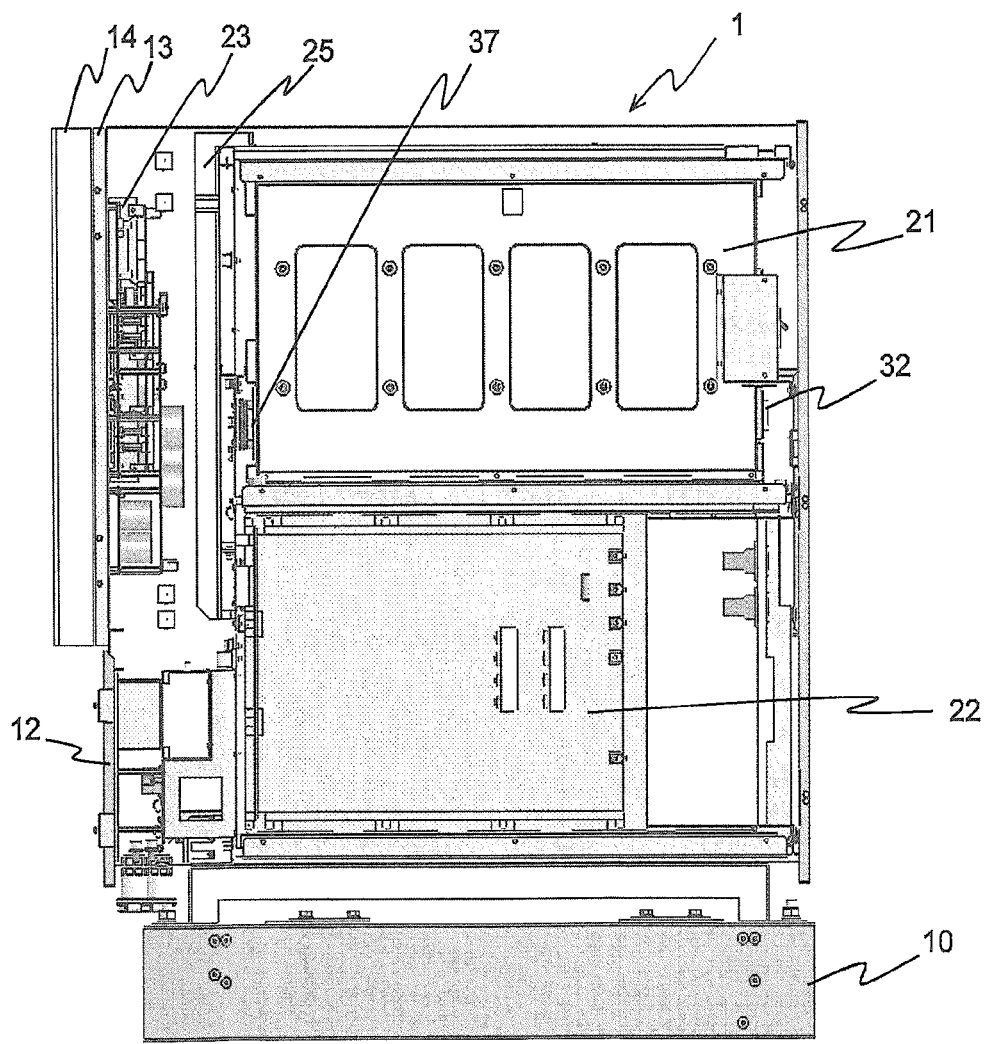
FIG. 2A is a side view for describing an inner portion of a chassis of a power storage device according to an exemplary embodiment of the present invention (with a side panel removed).
Figure 2B:
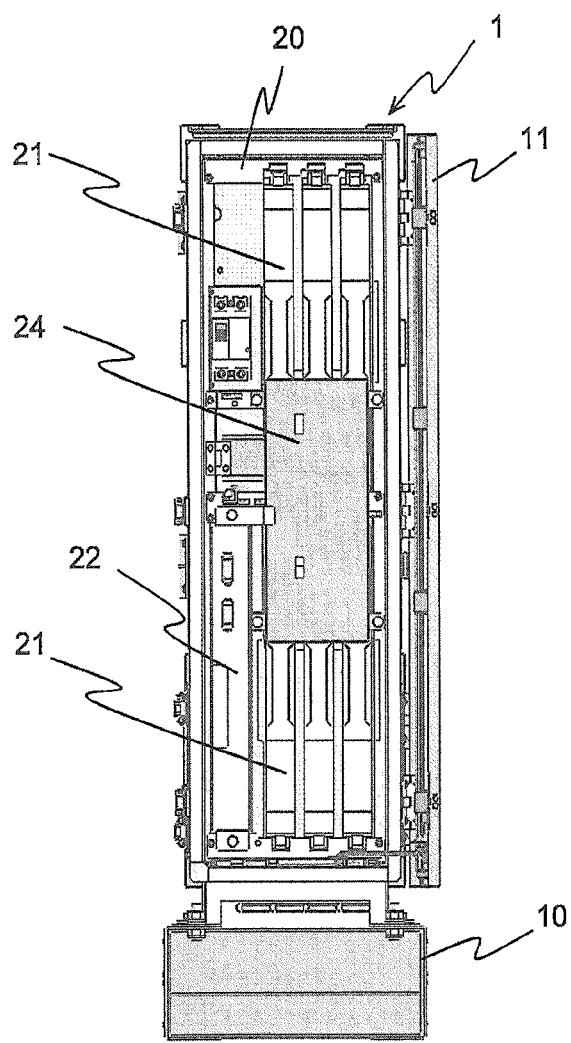
FIG. 2B is a front view for describing an inner portion of a chassis of a power storage device according to an exemplary embodiment of the present invention (with battery containing bodies housed therein and a front door opened).
Figure 3A:
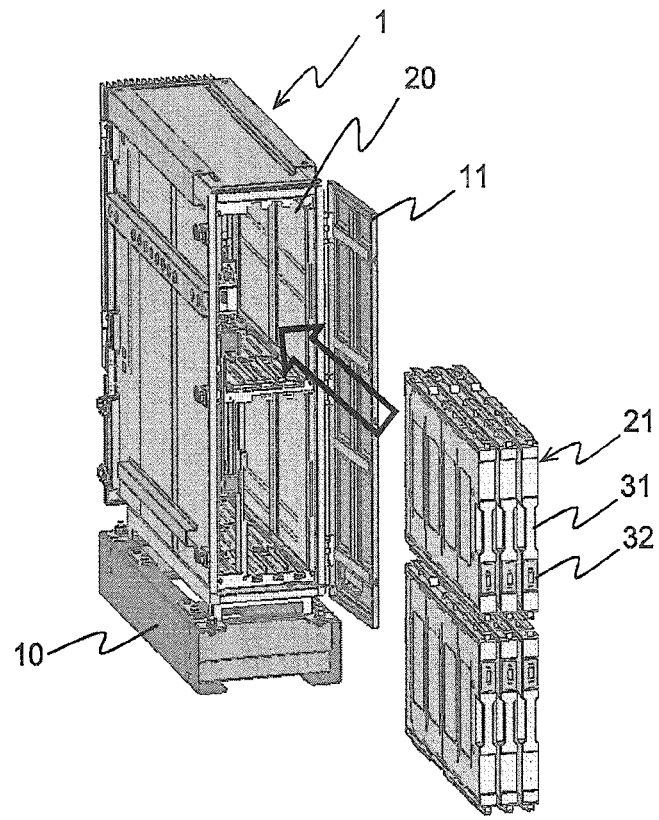
FIG. 3A is a front-side perspective view for describing a structure of a chassis of a power storage device according to an exemplary embodiment of the present invention.
Figure 4:
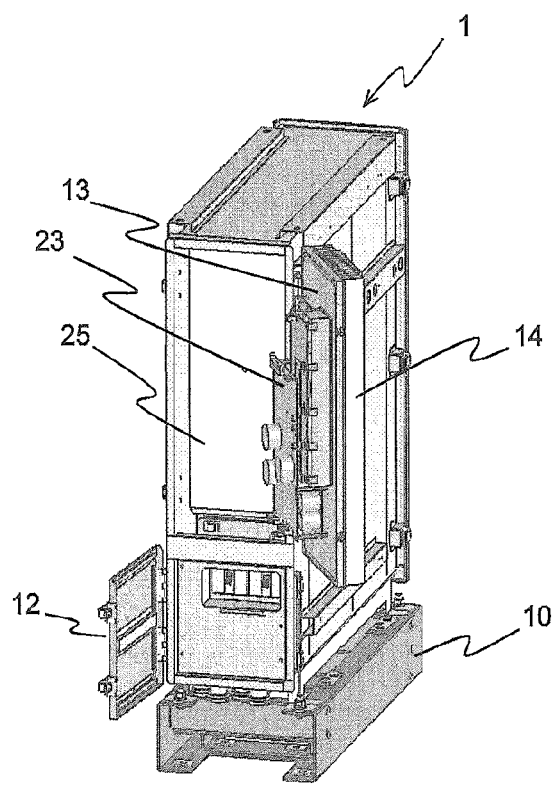
FIG. 4 is a rear-side perspective view for describing a structure of a chassis of a power storage device according to an exemplary embodiment of the present invention.

FIGS. 1A and 1B are a front-side perspective view and a rear-side perspective view illustrating an outer appearance of the chassis, respectively. FIGS. 2A and 2B are diagrams for describing the inside of the chassis: FIG. 2A is a side view with a side panel of the chassis removed; and FIG. 2B is a front view with front door 11 opened. FIGS. 3A and 4 are perspective views for describing a front-side structure and a rear-side structure of the chassis, respectively. For the chassis in the present exemplary embodiment, a cuboidal housing case, for example, a metal (for example, stainless steel) housing case having a cuboidal outer appearance, can be used. It is desirable that such chassis maintain airtightness and water-tightness sufficient for prevention of rainwater and dust intrusion. Here, in the description of the present exemplary embodiment, a surface that faces the installation surface such as the ground surface (horizontal surface) is a lower surface, and a surface on the upper side that faces the lower surface is an upper surface, and from among side surface portions forming a periphery of chassis 1, a side surface portion including opening 20 is a front surface (front). As appropriate, a direction perpendicular to the installation surface is referred to as "height direction" or "upright or vertical" and a direction that is parallel to the ground surface and along a side surface is referred to as "transverse or horizontal" or "width direction".

In the Figures, chassis 1 has a flat cuboidal shape, and a front portion and a rear portion of chassis 1 each has a vertical rectangular shape, and opposite side surface portions of chassis 1 each have a horizontal rectangular shape. A size of chassis 1 can be set to, for example, 900 mm in height, 300 mm in width of the front surface (vertically-long side surface) (length parallel to the installation surface, of a side surface provided with front door 11) and 800 mm in width of the side surfaces (horizontally-long side faces) (length parallel to the installation surface, of surfaces extending from the front door 11 side to the maintenance door 12 side).

Chassis 1 is provided with opening 20 in the vertically-long side surface (front surface), and is also provided with front door 11 (cover) for opening/closing the opening 20. As illustrated in FIGS. 1A and 3A, front door 11 can pivot about a pivot axis provided in the vicinity of an end portion of the door to open/close the opening (pivotable type), enabling enhancement in workability in installation, maintenance and inspection of the device. Instead of pivotable door 11, a detachable cover may be provided. A portion of contact between the door and the chassis is packed for keeping sufficient airtightness and water-tightness. As illustrated in FIG. 3A, each of battery containing bodies 21 can be inserted and removed through opening 20. Also, BMU 22 can be inserted and removed through opening 20.

As illustrated in FIGS. 2A and 2B, battery containing bodies 21 and BMU 22 are housed in chassis 1. Housed battery containing bodies 21 are supported by pivotable or detachable battery containing body cover 24, and thereby fixed to prevent movement of battery containing bodies 21 in the removal direction due to, e.g., shaking. Battery containing body cover 24 can be fixed via, e.g., bolt or screw fastening.

Figure 3B:
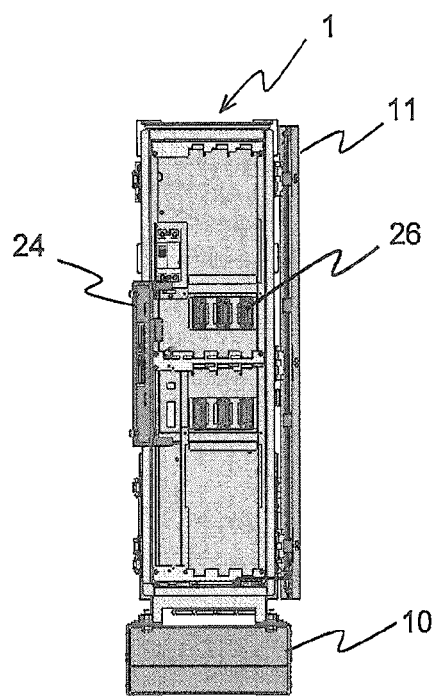
FIG. 3B is a front view for describing a structure of a chassis of a power storage device according to an exemplary embodiment of the present invention (with no battery containing bodies housed therein and a front door opened).

Battery containing bodies 21 each have a flat shape such as a flat cuboidal shape, and are arranged upright in parallel to one another so that respective end portions (vertically-long side surfaces) thereof face an opening face of opening 20. A plurality of battery containing bodies 21 are housed in each of a lower-tier housing space and an upper-tier housing space, forming a two-tier arrangement. In the example illustrated in FIGS. 2B and 3A, a total of six battery containing bodies, three on the lower tier side and three on the upper tier side, are housed. Principal surfaces (surfaces along the insertion direction and the height direction) of adjacent battery containing bodies face one another, and these principal surfaces are arranged in parallel to the side surfaces (side surfaces along a direction from the front door side to the maintenance door side) of chassis 1. Such arrangement of the flat shape battery containing bodies enables high-density housing. Also, such parallel arrangement of the plurality of upright battery containing bodies 21 can avoid the effect of the weight of the adjacent battery containing bodies compared to a case where transversely-mounted battery containing bodies are stacked, enabling prevention of occurrence of a failure due to deflection or deformation. Where a multi-tier housing space is provided to house the battery containing bodies, a support member having a strength sufficient to prevent the support member from deformation or breakage upon receipt of the full weight of the battery containing bodies housed in the upper-tier housing space is provided between the upper-tier hosing space and the lower-tier housing space. The support member is not limited to a shelf member having a mounting surface, and may be a frame or grid-shape one. FIG. 3B is a front view of the chassis with no battery containing bodies 21 housed. At a back surface of the battery containing body housing section, chassis-side connectors 26 that receive respective rear-side connectors 37 of the battery containing bodies are provided.

BMU 22 has a flat shape such as a flat cuboidal shape having a height that is similar to those of battery containing bodies 21, and is adjacent to the battery containing body arranged at an end portion of the lower-tier side arrangement, and is disposed upright so that an end portion (vertically-long side face) of the BMU faces opening 20. BMU 22 can be fixed via, e.g., bolt or screw fastening.

In a space immediately above BMU 22 (space adjacent to an end portion of the upper-tier side battery containing body arrangement), cables connected to electronic devices such as PCS unit 23 disposed on the rear side of chassis 1 can be arranged and a control panel including, e.g., a break switch can be provided.

As illustrated in FIGS. 1B, 2A and 4, on the rear side of chassis 1, maintenance door 12 and PCS-provided door 13 are provided. Heat sink 14 is provided on an outer surface of PCS-provided door 13, and PCS unit 23 is provided on an inner surface (inner-wall surface) of PCS-provided door 13. Heat insulating material 25 is provided at a position where heat insulating material 25 faces PCS unit 23 when the PCS-provided door 13 is closed.

Since heat sink 14 is provided on the outer surface of door 13 provided at the rear surface portion and PCS unit 23 is provided on the inner surface in such a manner that heat sink 14 and PCS unit 23 face each other via door 13, heat generated from PCS unit 23 can be released to the outside of the chassis by heat sink 14. Heat sink 14 may be provided integrally with PCS-provided door 13. PCS-provided door 13 with PCS unit 23 and heat sink 14 provided thereon is a pivotable one, and can open/close an opening on the upper side of the rear surface portion of the chassis body, thereby enhancing the workability in attachment or maintenance and inspection of PCS unit 23 and heat insulating material 25. Heat insulating material 25 is provided between the PCS unit 23, and housed battery containing body 21 and BMU 22. Consequently, the effect of heat generation by PCS unit 23 on battery containing bodies 21 and BMU 22 can be suppressed. A portion of contact between door 13 and chassis 1 is packed to keep sufficient airtightness and water-tightness.

Maintenance door 12 is a pivotable one, and can open/close an opening on the lower side of the rear surface portion of the chassis body, and inside the opening, fused switches, breakers or the like are arranged. Maintenance door 12 protects the switches, the breakers or the like from the external environment, and can easily be opened/closed, enhancing the workability in maintenance. A portion of contact between maintenance door 12 and chassis 1 is packed to keep sufficient airtightness and water-tightness.

As illustrated in, e.g., FIGS. 1A and 1B, chassis 1 can be installed on mount 10 and fixed via, e.g., bolts. The installation of chassis 1 on mount 10 can enhance the stability and prevent chassis 1 from falling, and can also prevent water exposure due to a puddle of rain water. Although not illustrated, in order to suppress the effects of direct sunlight and rain, a sunshade covering the upper surface of chassis 1 can be provided.

Next, a battery containing body that is suitable for the power storage device and the power storage system according to the present exemplary embodiment described above will further be described.

Figure 3C:
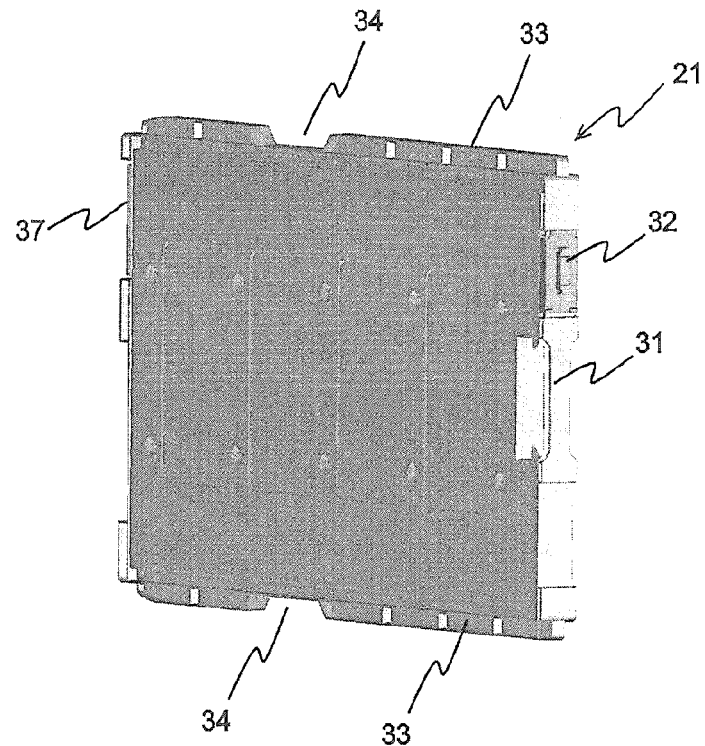
FIG. 3C is a perspective view of a battery containing body of a power storage device according to an exemplary embodiment of the present invention.

FIG. 3C is a perspective view of battery containing body 21 as placed upright. In the Figure, reference numeral 31 denotes a handle, reference numeral 32 denotes a front-side connector, reference numeral 33 denotes a projection portion for guide rail fitting, reference numeral 34 denotes a recess portion (support portion) and reference numeral 37 denotes a rear-side connector. Here, "placed upright" refers to a state in which battery containing body 21 is placed with a surface other than two principal surfaces having a largest area, as a bottom.

As illustrated in FIG. 3C, an outer appearance of battery containing body 21 can have a flat shape such as a flat cuboidal shape in which lengths in a longitudinal direction (insertion direction) of a lower end portion and an upper end portion of battery containing body 21 placed upright are longer than a length in a longitudinal direction (vertical direction) of an end portion on the front side in the insertion direction of battery containing body 21. Handle 31 is provided at the end portion on the front side in the direction of insertion to chassis 1. By holding handle 31, battery containing body 21 can easily be inserted to and removed from the power storage device.

At the end portion provided with handle 31, connector 32 is provided. The end portion faces the opening of chassis 1 when battery containing body 21 is housed in chassis 1, enabling attachment/detachment of a cable to/from connector 32 after insertion of battery containing body 21. Also, at an end portion on the opposite side of the end portion provided with handle 31 (back side in the insertion direction) of the battery containing body, a rear-side connector 37 is provided.

Battery containing body 21 is provided with recess portion 34 at least at a lower end portion thereof. At the time of insertion/removal of battery containing body 21, recess portion 34 functions as a support portion for supporting battery containing body 21 with one hand (in this case, the other hand can hold handle 31). In this case, the hand holding recess portion 34 is put in the recess portion, enabling prevention of slippage of the hand in the insertion/removal direction and thus facilitating the insertion/removal work. Also, when carrying battery containing body 21 around, recess portion 34 can be held, making it easy to hold the end portion provided with recess portion 34, and thus enabling prevention of drop of battery containing body 21 and enabling battery containing body 21 to be carried around easily. As illustrated in FIG. 3C, recess portion 34 is provided at each of the lower end portion and the upper end portion of battery containing body 21, resulting in an increase in holding position, which decreases the necessity to change the position of the battery containing body or a standing position when holding the battery containing body up, enhancing the workability. Each recess portion 34 is formed to have a size that can receive the fingers other than the thumb or the palm of a hand, making it easier to hold and enhancing the ease of holding. Each recess portion 34 is preferably provided on the back side relative to a center portion in the insertion direction. When the back side portion of the lower end portion of the battery containing body is raised with the hand that holds handle 31 as a support, the weight imposed on the other hand that holds recess portion 34 can be reduced compared to cases where the front side portion of the lower end portion is held. Also, the balance of the battery containing body is improved, whereby the battery containing body can easily be held up.

At each of the lower end portion and the upper end portion along the insertion direction of battery containing body 21, projection portions 33 that fit in respective guide rails in chassis 1 are provided. As illustrated in FIG. 3C, as the projection portions, at the lower end portion of the battery containing body, a first lower end portion-side projection portion extending in the insertion direction, and a second lower end portion-side projection portion extending in the insertion direction, which is provided apart from the first lower end portion-side projection portion, can be provided. Recess portion 34 provided at the lower end portion of the battery containing body 21 can be formed by a space between the first lower end portion-side projection portion and the second lower end portion-side projection portion. Also, as the projection portions, at the upper end portion of the battery containing body, a first upper end portion-side projection portion extending in the insertion direction and a second upper end portion-side projection portion extending in the insertion direction, which is provided apart from the first upper end portion-side projection portion, can be provided. Recess portion 34 provided at the upper end portion of the battery containing body 21 can be formed by a space between the first upper end portion-side projection portion and the second upper end portion-side projection portion.

Each battery containing body (for example, battery module) includes a plurality of secondary batteries in a case having a flat shape such as a flat cuboidal shape. At an inner surface of each of two principal surfaces of the case, a plurality of recess portions are provided, and the batteries can be arranged one by one in these recess portions. For example, a battery containing body that holds a total of eight batteries can be obtained by arranging four batteries on one principal surface and arranging four batteries on the other principal surface. The plurality of batteries in the case can be connected in series. This case can be provided with handle 31 and projection portions 33 by integral molding. Here, the arrangement, the number and the connection method of the plurality of batteries are not limited to the ones described above, and can arbitrarily be determined according to desired design specifications.

For the batteries in the battery containing bodies, film package batteries can be used. Each film package battery contains battery elements formed by alternately stacking positive electrodes and negative electrodes via separators, and the battery elements and an electrolyte solution are encapsulated in a container formed of a packaging film such as a laminate film. From the perspective of high-density housing in the case, it is desirable to use batteries having a flat cuboidal shape. For such batteries, lithium ion batteries are favorably used.

As already described with reference to FIGS. 2A, 2B and 3A, these battery containing bodies are arranged upright in parallel to one another in chassis 1. Each battery containing body is inserted with the end portion side provided with handle 31 as the front, and the end portion provided with the handle faces opening 20 (or the inner surface of closed front door 11) of the chassis. In FIG. 3A, the plurality of battery containing bodies 21 are illustrated in an integrated manner; however, the respective battery containing bodies are independent from one another and each can solely be transferred to/from chassis 1.

Battery containing bodies 21 housed in chassis 1 are connected in series, and adjacent battery containing bodies 21 are connected via a cable connecting front-side connectors 32. Each of opposite ends of the battery containing bodies connected in series is connected to BMU 22 via the cable connected to the front-side connector 32. Rear-side connectors 37 can be electrically connected to the BMU, whereby information indicating the states of the respective battery containing bodies is input to the BMU.

A reinforcement material may be attached to the outer side of chassis 1 as necessary. Also, the outer side of chassis 1 can be covered by exterior panels. For example, side panels covering opposite side surfaces and an upper panel covering the upper surface can be provided. The respective panels may be mutually fixed via rivets or welding or fixed to the chassis as necessary. Each panel can be formed using a member of a metal such as stainless steel.

Next, a structure for loading/unloading of battery containing bodies 21 and BMU 22 to/from the inside of chassis 1 will further be described.

According to the exemplary embodiment of the present invention, there can be provided a simple structure capable of restricting the order of loading and unloading of battery containing bodies 21 and BMU 22 to an order that causes no failure. As a result, when work for installation, maintenance and inspection of a power storage device is performed, loading/unloading of the battery containing bodies and the BMU is performed in the correct order, enabling prevention of a failure of the power storage device.

Figure 5A:
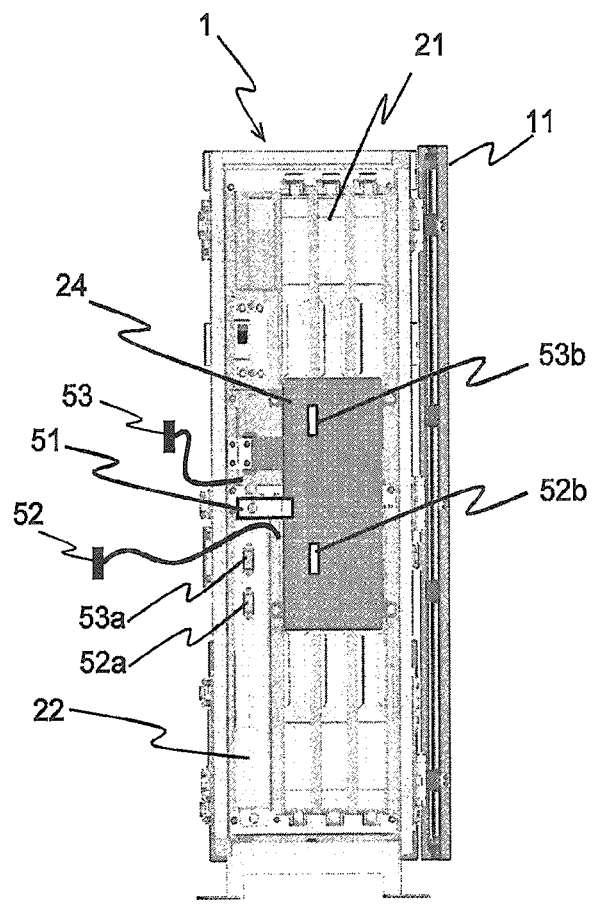
FIG. 5A is a front view of a chassis for describing a battery containing body loading/unloading structure in a power storage device according to an exemplary embodiment of the present invention (with battery containing bodies 21 and BMU 22 housed, battery containing body cover 24 closed and front door 11 opened).
Figure 5B:
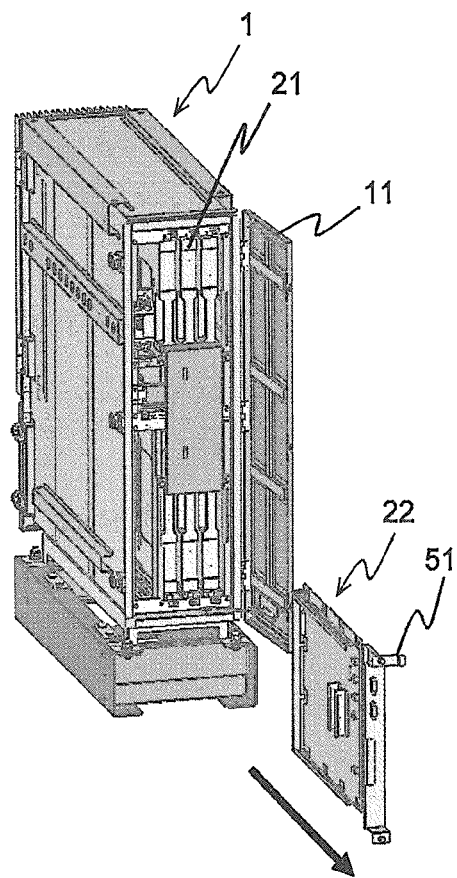
FIG. 5B is a perspective view of a chassis for describing a battery containing body loading/unloading structure in a power storage device according to an exemplary embodiment of the present invention (with BMU 22 removed, battery containing body cover 24 closed and front door 11 opened).
Figure 5C:
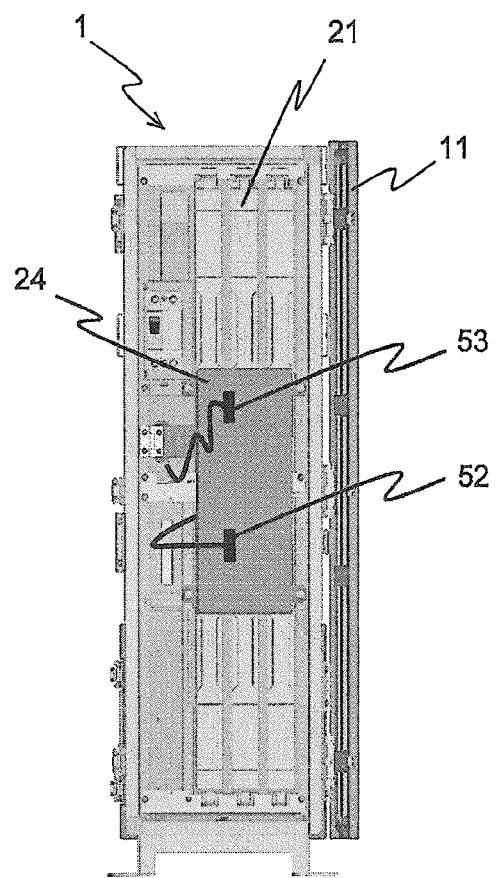
FIG. 5C is a front view of a chassis for describing a battery containing body loading/unloading structure in a power storage device according to an exemplary embodiment of the present invention (with BMU 22 removed, battery containing body cover 24 closed and front door 11 opened).

FIG. 5A is a front view of chassis 1 with battery containing bodies 21 and BMU 22 housed and battery containing body cover 24 closed, and FIGS. 5B and 5C are a perspective view and a front view of chassis 1 with battery containing bodies 21 housed, BMU 22 removed and battery containing body cover 24 closed, respectively. In these Figures, front door 11 is opened.

In the state illustrated in FIG. 5A, BMU 22 is housed adjacent to battery containing bodies 21, and opening prevention guide 51 provided at BMU 22 is in contact with a surface of pivotable battery containing body cover 24 (front surface of battery containing body cover 24 that faces the opening of chassis 1). Consequently, battery containing body cover 24 is prevented from pivoting. Here, opening prevention guide 51 may be disposed at a position spaced from battery containing body cover 24 as long as, even if opening prevention guide 51 is not in contact with battery containing body cover 24, upon battery containing body cover 24 pivoting, opening prevention guide 51 and battery containing body cover 24 come into contact with each other, preventing battery containing body cover 24 from opening. As illustrated in FIG. 5B, battery containing body cover 24 is made pivotable by removing BMU 22 from chassis 1. This structure ensures removing BMU 22 first and then removing battery containing bodies 21 in work for removing battery containing bodies 21 and BMU 22. As a result of removing BMU 22 first, leakage (counterflow) of power from battery containing bodies 21 to the other devices such as the PCS unit via BMU 22 unit can be prevented.

As illustrated in FIG. 5A to 5C, battery containing body cover 24 includes a plate-like portion that when closed, can cover at least a part of the end portion (front surface facing opening 20) of each battery containing body as housed. Consequently, unless battery containing body cover 24 is opened, battery containing bodies 24 cannot be removed. Also, battery containing bodies 21 can be forced in the insertion direction and fixed by battery containing body cover 24. Battery containing body cover 24 can pivot toward a BMU housing section, and for example, as illustrated in FIGS. 5A to 6B, can be made pivotable by providing a rotation axis such as a hinge around a position immediately above the BMU housing section. As a result of battery containing body cover 24 being pivotable, it is easy to open/close battery containing body cover 24. If chassis 1 includes a lower-tier first housing section and an upper-tier second housing section and battery containing bodies 21 are housed in each of the first and second housing sections, as illustrated in FIG. 5A, battery containing body cover 24 covers an upper portion of the front surface of each of the battery containing bodies housed on the lower tier side and a lower portion of the front surface of each of the battery containing bodies housed on the upper tier side. Consequently, all the battery containing bodies arranged in the two tiers can be restricted from being removed, and fixed by single battery containing body cover 24. However, it is necessary that BMU 22 can be removed and inserted when battery containing body cover 24 is closed, and thus, the shape and disposition of battery containing body cover 24 are determined so as not to interrupt a BMU insertion/removal route.

For opening prevention guide 51, an elongated plate that when the BMU is housed, extends up to the surface of battery containing body cover 24, for example, such as illustrated in FIGS. 5A and 5B, can be used. Although opening prevention guide 51 extends in a transverse direction (direction parallel to the installation surface) in FIG. 5A, opening prevention guide 51 may be made to extend in the height direction (vertical direction in the Figure) and thereby disposed on a support portion connected to the hinge of battery containing body cover 24 or a movable part of the hinge. Also, opening prevention guide 51 can be provided at an upper end portion or a lower end portion (upper end portion in the case illustrated in FIG. 5A) of a front surface (surface facing opening 20) of BMU 22 placed upright. As illustrated in FIG. 5A, where each of the upper end portion and the lower end portion of the front surface of BMU 22 is fixed to chassis 1 via, e.g., a bolt, BMU 22 can be fixed together with opening prevention guide 51.

Figure 6A:
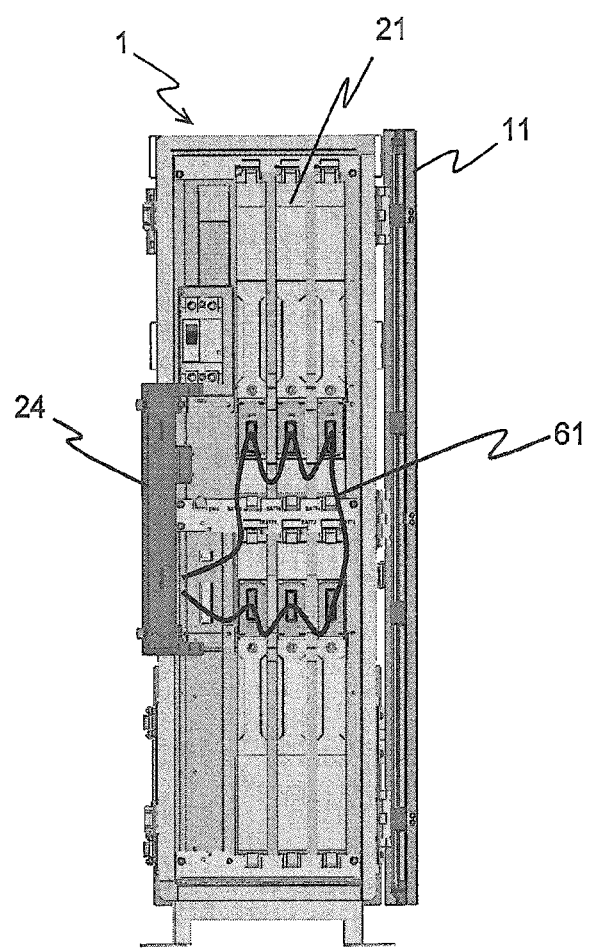
FIG. 6A is a front view of a chassis for describing a battery containing body loading/unloading structure in a power storage device according to an exemplary embodiment of the present invention (with BMU 22 removed, and battery containing body cover 24 and front door 11 opened).

As illustrated in FIG. 5C, connectors 52 and 53 that had been connected to respective connectors 52*a* and 53*a* of BMU 22 can be temporarily put in respective connector holding holes 52*b* and 53*b* provided in battery containing body cover 24. As illustrated in FIG. 6A, connectors 52 and 53 are connected to the respective battery containing bodies via cable 61. Use of connector holding holes 52*b* and 53*b* for connector attachment/detachment work enables workability enhancement and prevention of short-circuit caused by the removed connectors.

FIG. 6A is a front view of chassis 1 with BMU 22 removed and battery containing body cover 24 opened. FIG.

6B is a perspective view of chassis 1 with BMU 22 and battery containing body 21 removed and battery containing body cover 24 opened. In these Figures, front door 11 is opened.

Figure 6B:
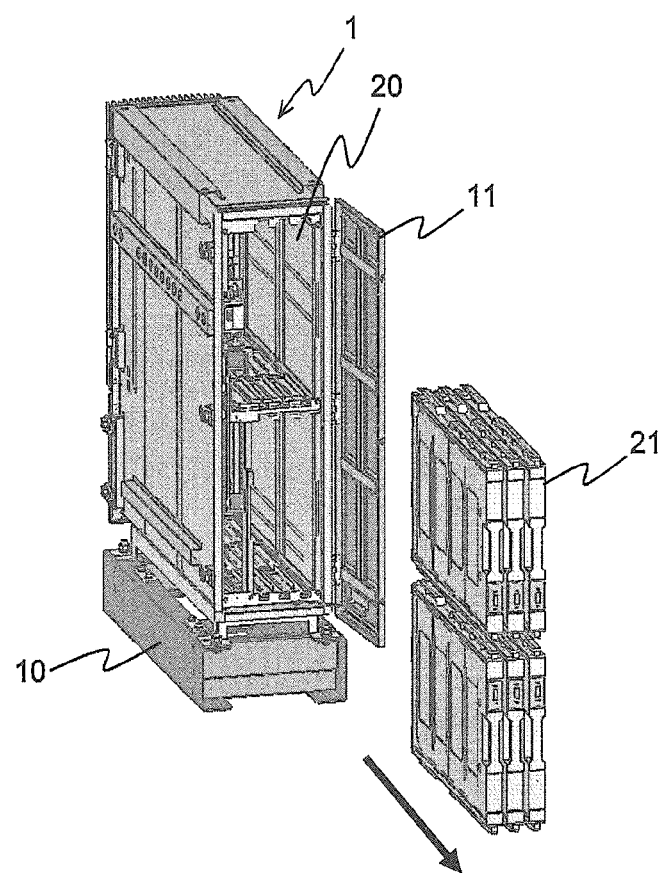
FIG. 6B is a perspective view of a chassis for describing a battery containing body loading/unloading structure in a power storage device according to an exemplary embodiment of the present invention (with BMU 22 and battery containing bodies 21 removed and battery containing body cover 24 and front door 11 opened).

After removal of BMU 22, as illustrated in FIG. 6A, battery containing body cover 24 is opened. After removal of connectors of cable 61 from respective connectors of battery containing bodies 21, as illustrated in FIG. 6B, battery containing bodies 21 are removed from chassis 1 in the arrow direction in the Figure. Although in FIG. 6B, the plurality of battery containing bodies 21 are illustrated in an integrated manner, the respective battery containing bodies are separated from one another and each battery containing body can solely be transferred to/from chassis 1.

Work for inserting battery containing body 21 and BMU 22 to chassis 1 is the reverse of the above-described removal work. In other words, as illustrated in FIG. 6B, battery containing bodies 21 are inserted to chassis 1 in a direction opposite to the arrow direction in the Figure. Here, battery containing body cover 24, when opened, pivots toward the housing section for BMU 22 and thus is positioned so as to interrupt the path for insertion of BMU 22, whereby insertion of BMU 22 is prevented. This structure ensures inserting battery containing bodies 21 first and then inserting BMU 22 in work for inserting battery containing bodies 21 and BMU 22. If insertion and connection of battery containing bodies 21 are performed after insertion of BMU 22, a failure may occur as a result of leakage (counterflow) of power from battery containing bodies 21 to the other devices such as the PCS unit via BMU 22, and the present exemplary embodiment enables prevention of such failure. In order to keep battery containing body cover 24 open, an elastic member such as a torsion spring can be provided to the rotation axis portion such as the hinge to fix the axis, or battery containing body cover 24 as opened can be locked via, e.g., a stopper. Battery containing body cover 24, when closed, can be fixed via bolt or screw fastening, or locked via, e.g., a stopper.

Next, as illustrated in FIG. 6A, the connectors of plug cable 61 are connected to the respective connectors of battery containing bodies 21 to connect battery containing bodies 21 in series, and then, as illustrated in FIG. 5C, battery containing body cover 24 that is interrupting the path for insertion of BMU 22 is closed. Subsequently, as illustrated in FIG. 5B, BMU 22 is inserted to the inside of chassis 1 in a direction opposite to the arrow direction in the Figure. Next, as illustrated in FIG. 5A, connectors 52 and 53 at opposite ends of cable 61 are pulled out from respective connector holding holes 52b and 53b and connected to respective connectors 52a and 53a of the BMU.

As described above, the battery containing bodies and the BMU are loaded/unloaded in the correct order at the time of work for installation, maintenance and inspection of the power storage device, enabling prevention of a failure of the power storage device.

The present invention has been described above with reference to the exemplary embodiments, however the present invention is not limited to the above exemplary embodiments. Various modifications that can be understood by those skilled in the art may be made to the constitution and details of the present invention within the scope thereof.

The present application claims the right of priority based on Japanese Patent Application No. 2012-60725 filed on Mar. 16, 2012, the entire disclosure of which is incorporated herein by reference.

REFERENCE SIGNS LIST 1 chassis
10 mount
11 front door (cover)
12 maintenance door
13 PCS-provided door
14 heat sink
20 opening
21 battery containing body
22 BMU
23 PCS unit
24 battery containing body cover
25 heat insulating material
26 chassis-side connector
31 handle
32 front-side connector of battery containing body
33 projection portion for guide rail fitting
34 recess portion (support portion)
35 protrusion portion (first protrusion portion)
36 protrusion portion (second protrusion portion)
37 rear-side connector of battery containing body
51 opening prevention guide
52 connector
52a connector
52b connector holding hole
53 connector
53a connector
53b connector holding hole
61 connector cable

The invention claimed is:

1. A power storage device comprising a battery containing body, an electronic device unit, and a chassis for housing the battery containing body and the electronic device unit,
wherein at a side surface portion of the chassis, an opening for inserting and removing the battery containing body and the electronic device unit via the side surface portion is provided;
an openable and closable pivoting member is provided inside the opening, the pivoting member, when closed, preventing removal of the battery containing body, and when opened, preventing insertion of the electronic device unit as removed; and
the electronic device unit is housed and disposed adjacent to the battery containing body, and includes an opening prevention guide capable of engaging with the pivoting member and thereby preventing the pivoting member from being opened when the electronic device unit is housed.

2. The power storage device according to claim 1, wherein in a state in which the electronic device unit is housed, the opening prevention guide is in contact with a surface of the pivoting member when the pivoting member is closed or pivots.

3. The power storage device according to claim 1 or 2, wherein the pivoting member, when opened, pivots toward a housing section for the electronic device unit and is thereby positioned so as to interrupt a path for insertion of the electronic device unit.

4. The power storage device according to claim 1, wherein the pivoting member, when closed, covers at least a part of an end portion of the battery containing body, the end portion facing the opening, thereby preventing the battery containing body from being removed.

5. The power storage device according to claim 1, wherein the pivoting member is provided with a holding hole for holding a cable connector for connection to the electronic device unit when the cable connector is not connected.

6. The power storage device according to claim 1, wherein more than one said battery containing body is included, and the respective battery containing bodies have a flat shape and are arranged upright in parallel such that end portions of the battery containing bodies face the opening; and the electronic device unit is disposed adjacent to a battery containing body at an end of the arrangement of the battery containing bodies.

7. The power storage device according to claim 6, wherein the electronic device unit has a flat shape, and is placed upright such that an end portion of the electronic device unit faces the opening.

8. The power storage device according to claim 6, wherein the chassis includes a first housing section on a lower-tier side and a second housing section on an upper-tier side, and the battery containing bodies are arranged in parallel in each of the first and second housing sections.

9. The power storage device according to claim 1, wherein the chassis includes a cover body that can open and close the opening.

10. The power storage device according to claim 1, wherein the electronic device unit is a battery management unit.

11. The power storage device according to claim 1, further comprising a power conditioner.

12. The power storage device according to claim 11, wherein the chassis has a cuboidal shape including a first side surface portion including the opening, and a second side surface portion facing the first side surface portion; and the power conditioner is installed on an inner wall surface of the second side surface portion.

13. The power storage device according to claim 1, wherein the battery containing body holds a film package battery.

14. The power storage device according to claim 1, wherein the battery containing body holds a lithium ion secondary battery.

15. The power storage device according to claim 1, wherein the battery containing body is a battery module.

16. A power storage system comprising a power storage device according to claim 1, and a control system unit for controlling the power storage device.

* * * * *